(12) United States Patent
Guo et al.

(10) Patent No.: US 10,679,854 B2
(45) Date of Patent: Jun. 9, 2020

(54) WAFER BONDING METHOD AND STRUCTURE THEREOF

(71) Applicant: Yangtze Memory Technologies Co., Ltd., Wuhan, Hubei (CN)

(72) Inventors: Shuai Guo, Hubei (CN); Jia Wen Wang, Hubei (CN); Tao Tao Ding, Hubei (CN); Rui Yuan Xing, Hubei (CN); Xiao Jin Wang, Hubei (CN); Jia You Wang, Hubei (CN); Chun Long Li, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,172

(22) Filed: Jul. 26, 2018

(65) Prior Publication Data

US 2019/0051524 A1 Feb. 14, 2019

Related U.S. Application Data

(63) Continuation of application No. PCT/CN2018/088954, filed on May 30, 2018.

(30) Foreign Application Priority Data

Aug. 10, 2017 (CN) .......................... 2017 1 0681131

(51) Int. Cl.
*H01L 21/18* (2006.01)
*H01L 21/20* (2006.01)
(Continued)

(52) U.S. Cl.
CPC ...... *H01L 21/187* (2013.01); *H01L 21/02057* (2013.01); *H01L 21/2007* (2013.01);
(Continued)

(58) Field of Classification Search
None
See application file for complete search history.

(56) References Cited

U.S. PATENT DOCUMENTS

| 2006/0141745 A1 | 6/2006 | Yang |
| 2008/0128851 A1 | 6/2008 | Aga et al. |

(Continued)

FOREIGN PATENT DOCUMENTS

| CN | 102376653 A | 3/2012 |
| CN | 103832970 A | 6/2014 |

(Continued)

OTHER PUBLICATIONS

International Search Report and Written Opinion of the International Searching Authority directed to related International Patent Application No. PCT/CN2018/088954, dated Jul. 24, 2018; 8 pages.

*Primary Examiner* — Steven M Christopher
(74) *Attorney, Agent, or Firm* — Sterne, Kessler, Goldstein & Fox P.L.L.C.

(57) ABSTRACT

Embodiments of wafer bonding method and structures thereof are disclosed. The wafer bonding method can include performing a plasma activation treatment on a front surface of a first and a front surface of a second wafer; performing a silica sol treatment on the front surfaces of the first and the second wafers; performing a preliminary bonding process of the first and the second wafer; and performing a heat treatment of the first and the second wafers to bond the front surface of the first wafer to the front surface of the second wafers.

19 Claims, 7 Drawing Sheets

(51) Int. Cl.
*H01L 21/762* (2006.01)
*H01L 21/02* (2006.01)
*H01L 21/26* (2006.01)
*H01L 21/324* (2006.01)

(52) U.S. Cl.
CPC ............ *H01L 21/26* (2013.01); *H01L 21/324* (2013.01); *H01L 21/76251* (2013.01)

(56) References Cited

U.S. PATENT DOCUMENTS

| | | | |
|---|---|---|---|
| 2008/0227270 A1* | 9/2008 | Chan | H01L 21/02052 438/455 |
| 2012/0043647 A1 | 2/2012 | Gaudin | |
| 2012/0229893 A1* | 9/2012 | Hebrink | G02B 1/04 359/359 |
| 2014/0103353 A1* | 4/2014 | Ishibashi | H01L 21/2007 257/76 |
| 2014/0235031 A1* | 8/2014 | Herbots | H01L 21/187 438/455 |
| 2015/0118825 A1 | 4/2015 | Ishizuka | |
| 2015/0240105 A1* | 8/2015 | Jing | C08J 7/047 524/520 |
| 2016/0025900 A1* | 1/2016 | Suzuki | B32B 23/20 257/40 |
| 2017/0183255 A1 | 6/2017 | Walther et al. | |
| 2019/0051524 A1 | 2/2019 | Guo et al. | |
| 2019/0176435 A1 | 6/2019 | Bellman et al. | |

FOREIGN PATENT DOCUMENTS

| | | |
|---|---|---|
| CN | 105176179 A | 12/2015 |
| CN | 105197880 A | 12/2015 |
| CN | 105206536 A | 12/2015 |
| CN | 107633997 A | 1/2018 |
| KR | 2007/0100687 A | 10/2007 |
| TW | 201615581 A | 5/2016 |
| TW | 201825623 A | 7/2018 |
| WO | WO-2013/161188 A1 | 10/2013 |

* cited by examiner

WAFER BONDING METHOD AND STRUCTURE THEREOF

CROSS-REFERENCE TO RELATED APPLICATIONS

This application claims priority to Chinese Patent Application No. 201710681131.4 filed on Aug. 10, 2017 and PCT Application No. PCT/CN2018/088954 filed on May 30, 2018, the entire content of which is incorporated herein by reference.

BACKGROUND

Embodiments of the present disclosure relate to the field of semiconductor manufacturing technology, and in particular to wafer bonding method.

Wafer bonding is deployed in a wide range of semiconductor process applications for forming semiconductor devices. There are a number of wafer bonding methods, including adhesive boding, anodic bonding, direct wafer bonding, metal bonding, and hybrid metal/dielectric bonding.

Direct wafer bonding refers to a process where two separate wafer surfaces are brought into contact and are bonded without any intermediate adhesives or external force. Currently direct wafer bonding has many applications in the microelectronics industry. Examples of semiconductor process applications include substrate engineering, fabrication of integrated circuits, packaging and encapsulation of micro-electromechanical-systems (MEMS) and stacking of many processed layers (3D-integration) of pure microelectronics. These different applications require usually more than just a typical silicon wafer bonding process (wafer contacting and annealing at 1100° C.). Bonding of processed wafers or wafers with a large difference in thermal expansion coefficients requires a low-temperature bonding process.

BRIEF SUMMARY

Embodiments of wafer bonding method and structures thereof are disclosed herein.

Disclosed is a wafer bonding method, including: performing a plasma activation treatment on a front surface of a first wafer and a front surface of a second wafer; performing a silica sol treatment on the front surfaces of the first and the second wafers; applying a preliminary bonding process to the first and second wafer; and performing a heat treatment to the first and second wafers to bond the front surface of the first wafer to the front surface of the second wafer.

In some embodiments, the method further includes polishing the front surfaces of the first and the second wafers prior to the plasma activation treatment.

In some embodiments, the polishing process includes chemical mechanical polishing, wet chemical cleaning, or a combination thereof.

In some embodiments, the plasma activation treatment includes using oxygen or nitrogen as a plasma gas.

In some embodiments, the plasma activation treatment is performed with a processing pressure between about 0.05 mbar and 0.5 mbar.

In some embodiments, the plasma activation treatment is performed with a high frequency discharge power between about 40 watts and 100 watts.

In some embodiments, the plasma activation treatment is performed with a low frequency discharge power between about 10 watts and 40 watts.

In some embodiments, the plasma activation treatment is performed between about 5 seconds and 50 seconds.

In some embodiments, the plasma activation treatment includes using nitrogen as the plasma gas and is performed with a processing pressure at 0.3 mbar, the high frequency discharge power of about 60 watts, and the low frequency discharge power of about 25 watts.

In some embodiments, the plasma activation treatment includes using oxygen as the plasma gas and is performed with a processing pressure at 0.1 mbar, the high frequency discharge power of about 70 watts, and the low frequency discharge power of about 35 watts.

In some embodiments, the plasma activation treatment includes using oxygen as the plasma gas and is performed with a processing pressure at 0.5 mbar, the high frequency discharge power of about 60 watts, and the low frequency discharge power of about 30 watts.

In some embodiments, the plasma activation treatment includes using oxygen as the plasma gas and is performed with a processing pressure at 0.5 mbar, the high frequency discharge power of about 60 watts, and the low frequency discharge power of about 25 watts.

In some embodiments, performing the silica sol treatment includes rinsing the front surfaces of the first and the second wafers with the silica sol having a plurality of $SiO_2$ nanoparticles with a diameter smaller than 10 nm.

In some embodiments, performing the silica sol treatment includes rinsing the front surfaces of the first and the second wafers with the silica sol having a $SiO_2$ nanoparticles weight concentration of no more than 35%.

In some embodiments, performing the silica sol treatment includes rinsing the front surfaces of the first and the second wafers with the silica sol having the $SiO_2$ nanoparticles weight concentration between about 1% and 30%.

In some embodiments, rinsing the front surfaces of the first and the second wafers with the silica sol includes rotating the first and second wafers at a rotation speed of between about 50 rpm and 1000 rpm.

In some embodiments, rinsing the front surfaces of the first and the second wafers with the silica sol includes rotating the first and second wafers at a rotation speed of about 200 rpm.

In some embodiments, rinsing the front surfaces of the first and second wafers is performed for between about 10 and 30 seconds.

In some embodiments, the method further includes a drying process after rinsing the front surfaces of the first and the second wafers with the silica sol and prior to the preliminary bonding process.

In some embodiments, the method further includes, prior to rinsing the front surface of the first and the second wafers with the silica sol, water rinsing the front surfaces of the first and the second wafers.

In some embodiments, the method can further include, prior to the preliminary bonding process, positioning the front surfaces of the first and the second wafers opposed to one another at a distance of between about 20 μm and 100 μm.

In some embodiments, the preliminary bonding process includes applying a first pressure between about 80 and 200 mbar at a center zone of the first and the second wafers to bring the center zones into contact.

In some embodiments, the preliminary bonding process further includes applying a second pressure at a first outer annular zone of the first and the second wafers to bring the first outer annular zones into contact.

In some embodiments, the preliminary bonding process further includes applying a third pressure at a second outer annular zone of the first and the second wafers to bring the wafers into full contact.

In some embodiments, the heat treatment is performed at about 200-450° C. for about 1-2 hours under a nitrogen atmosphere.

In some embodiments, the heat treatment includes forming a covalent bond of at least 2.0 $J/m^2$ between the first and the second wafers.

In some embodiments, a wafer bonding method, including: performing a plasma activation treatment on a front surface of a first wafer and a front surface of a second wafer; performing a silica sol treatment on the front surface of the first wafer or the front surface of the second wafer;

performing a preliminary bonding process on the first and second wafers; and performing a heat treatment of the first and the second wafers to form a bond between the first and the second wafers.

Another aspect of the present disclosure provides a semiconductor structure obtained by any one of the above wafer bonding method.

Another aspect of the present disclosure provides a semiconductor structure, including a first wafer, a second wafer, and a plurality of covalent bonds between the first and the second wafers, wherein the plurality of covalent bonds has a bond strength of at least 2.0 $J/m^2$.

In some embodiments, the plurality of covalent bonds is Si—O—Si.

In some embodiments, the first wafer includes $SiO_2$, $Si_3N_4$, or a nitrogen-doped silicon carbide.

In some embodiments, the second wafer includes $SiO_2$, $Si_3N_4$, or a nitrogen-doped silicon carbide.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" or "wafer" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "sol" refers to a colloidal suspension of solid particles in a liquid.

As used herein, the term "silica sol" refers to a colloidal suspension of silica nanoparticles in a liquid.

As used herein, the term "nanoparticle" is a structure having at least one region or characteristic dimension with a dimension of less than about 200 nm. In some embodiments, the nanoparticle has a dimension of less than about 100 nm, less than about 50 nm, less than about 20 nm, or less than about 10 nm. Typically, the region or characteristic dimension will be along the smallest axis of the nanoparticle structure.

As used herein, the "diameter" of a nanoparticle refers to the diameter of a cross-section normal to a first axis of the nanoparticle, where the first axis has the greatest difference in length with respect to the second and third axes (the second and third axes are the two axes whose lengths most nearly equal each other). The first axis is not necessarily the longest axis of the nanoparticle; e.g., for a disk-shaped nanoparticle, the cross-section would be a substantially circular cross-section normal to the short longitudinal axis of the disk. Where the cross-section is not circular, the diameter is the average of the major and minor axes of that cross-section. For a spherical nanoparticle, the diameter is measured from one side to the other through the center of the sphere.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "vertical/vertically" means nominally perpendicular to a lateral surface of a substrate.

Figure 1A:
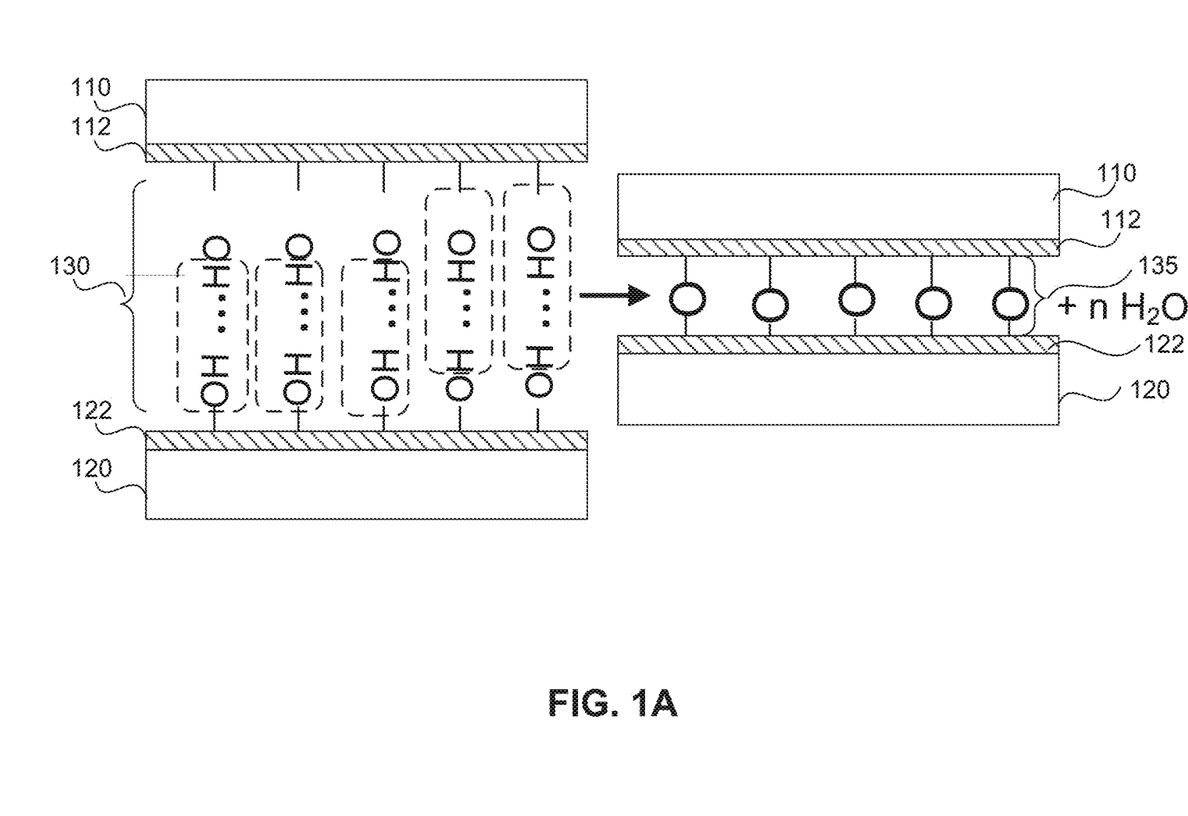
FIGS. 1A and 1B illustrate a wafer bonding method.

Plasma activation bonding is a direct wafer bonding method. Plasma activation bonding method can include polishing and cleaning a front surface of a first wafer and a front surface of a second wafer, performing a plasma activation, rinsing the front surface of the wafers with deionized water, followed by preliminary bonding, and finally performing a heat treatment to bond the first and the second wafers. As shown in FIG. 1A, after rinsing with deionized water, first wafer 110 and second wafer 120 are positioned face to face with front surface 112 of first wafer 110 facing towards front surface 122 of second wafer 120, with a layer of hydroxyl groups 130 in between. After the heat treatment, covalent bond Si—O—Si forms in interface layer 135 between front surface 112 of first wafer 110 and front surface 122 of second wafer 120, bonding the two wafers together. As used herein, the term "front surface" of a structure refers to the surface of the structure at which a device is formed or will be subsequently formed.

Figure 1B:
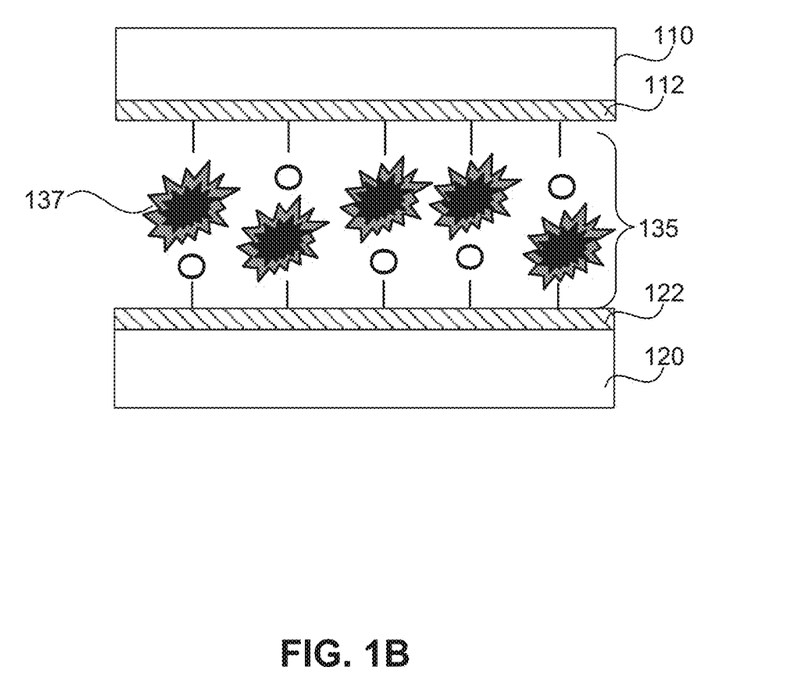

The above-mentioned bonding method relies on van der Waals forces and hydrogen bonding in the hydroxyl groups to achieve preliminary bonding prior to the heat treatment. During the heat treatment, water molecules are removed in condensation reactions to form covalent bonds between front surfaces of the first and second wafers to achieve a stabilized bonding. As illustrated in FIG. 1B, low hydroxyl content of deionized water used in the pretreatment process is insufficient to achieve stable covalent bonding, causing wafer debonding 137 in interface layer 135.

Various embodiments in accordance with the present disclosure provide wafer bonding methods and semiconductor structures thereof. The wafer bonding method disclosed herein can include: performing a plasma activation treatment on a front surface of a first wafer and a front surface of a second wafer; performing a silica sol treatment on the front surfaces of the first and the second wafers; applying a preliminary bonding process to the first and second wafer; and performing a heat treatment to the first and second wafers to bond the front surface of the first wafer to the front surface of the second wafers. As a result, wafer bonding methods disclosed herein provides, among other things, benefits of (i) sufficient hydroxyl groups on bonding surfaces during the bonding process to improve wafer bonding strength; (ii) providing a larger process window for subsequent processes; (iii) improving device structure stability and reliability to streamline fabrication process; and (iv) reducing production cost and improving device quality.

Figure 2:
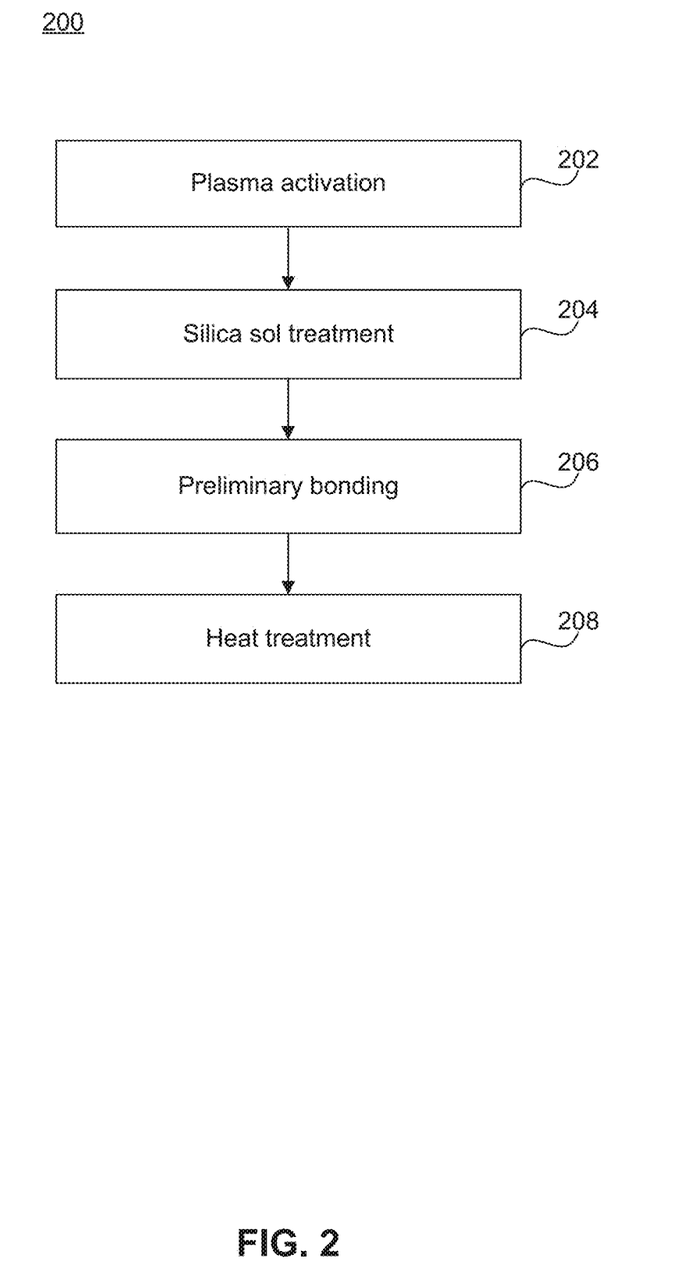
FIG. 2 is a flowchart of an exemplary wafer bonding method, according to some embodiments of the present disclosure.

FIG. 2 is a flowchart of an exemplary wafer bonding method 200, according to some embodiments of the present disclosure. FIGS. 3A-3F illustrate an exemplary fabrication process for wafer bonding, according to some embodiments of the present disclosure. FIGS. 4A-4B are cross-sectional views of the first and second wafers prior to and after heat treatment, according to some embodiments of the present disclosure.

It should be understood that operations shown in method 200 and the fabrication method shown in FIGS. 3A-4B are not exhaustive and that other methods and operations can be performed as well before, after, or between any of the illustrated methods and operations.

Figure 3A:
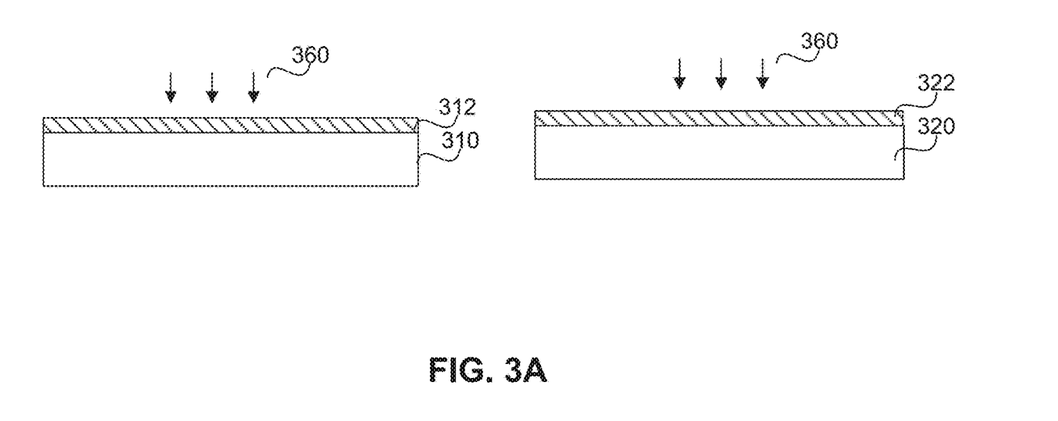
FIGS. 3A-3F illustrate an exemplary fabrication process for wafer bonding, according to some embodiments of the present disclosure.
Figure 4A:
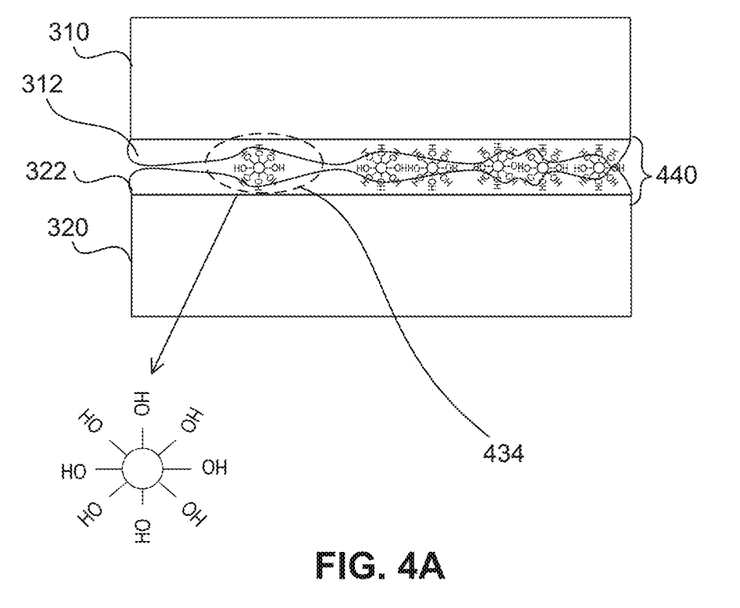
FIGS. 4A-4B are cross-sectional views of the first and the second wafers prior to heat treatment (FIG. 4A) and after heat treatment (FIG. 4B), according to some embodiments of the present disclosure.
Figure 4B:
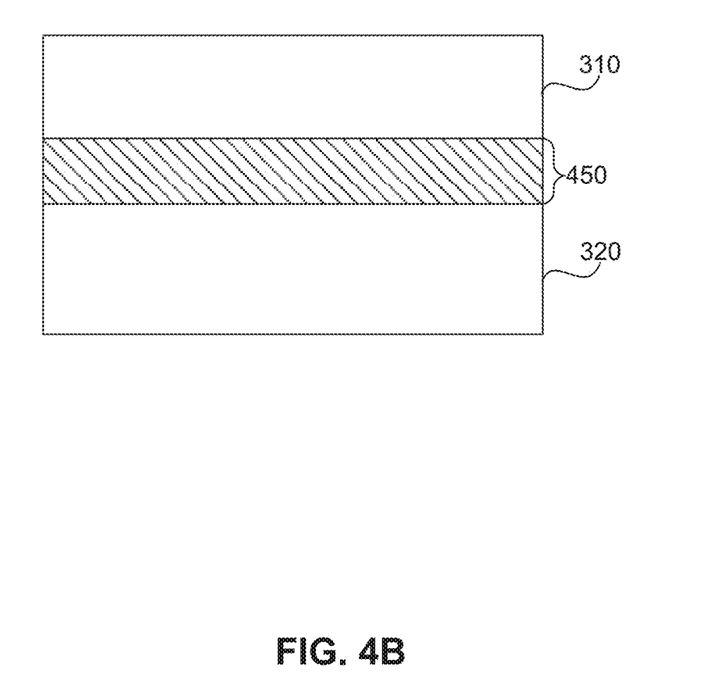

Referring to FIG. 2 and FIG. 3A, method 200 starts at operation 202, in which plasma activation 360 is performed on front surface 312 of first wafer 310 and front surface 322 of second wafer 320.

In some embodiments, first wafer 310 and second wafer 320 can include silicon, germanium, a III-V semiconductor, silicon carbide, silicon on insulating substrate, or a combination thereof. In some embodiments, first wafer 310 and second wafer 320 can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof.

In some embodiments, front surface 312 of first wafer 310 and front surface 322 of second wafer 320 can include a dielectric layer of oxides, nitrides, carbides or a combination thereof. In some embodiments, front surface 312 of first wafer 310 and front surface 322 of second wafer 320 can include $SiO_2$, $Si_3N_4$, or a nitrogen-doped silicon carbide. In some embodiments, front surface 312 can be a portion of first wafer 310 and formed using the same material. Similarly, front surface 322 can be a portion of second wafer 320.

Fabrication methods to form the dielectric layer includes, but not limited to, lithography, etching, deposition, filling, polishing, or a combination thereof.

In some embodiments, in preparation for wafer bonding prior to subsequent plasma activation treatment, the front surfaces of the first and second wafers are deposited with $SiO_2$ layers, and then planarized using, for example, a chemical-mechanical polishing technique. In some embodiments, the first and second wafers to be bonded are not limited to those with extrinsically deposited $SiO_2$ layers, but can also include surfaces, such as glass substrates, having intrinsic silicon oxide surfaces.

In some embodiments, plasma gases used in the plasma activation includes, but not limited to, oxygen, nitrogen, argon or a combination thereof. In some embodiments, the plasma gas can be oxygen. In some embodiments, the plasma gas can be nitrogen. In some embodiments, the plasma gas can further include other gases such as hydrogen and/or water. Concentration of plasma gases can be less than about 5%. In some embodiments, the plasma activation treatment is performed with a processing pressure between about 0.05 mbar and 0.5 mbar. In some embodiments, the plasma activation treatment is performed with a high frequency discharge power of about 40-100 watts (W). In some embodiments, the plasma activation treatment is performed with a low frequency discharge power of about 10-40 watts (W). In some embodiments, the plasma activation treatment is performed for a processing time between about 5 seconds and 50 seconds. In some embodiments, a chemical activation treatment can also be performed.

In some embodiments, the plasma activation treatment can be performed using nitrogen as the plasma gas with a flow rate of about 50 sccm, with a processing pressure of about 0.3 mbar, and with a high frequency discharge power of about 60 W and a low frequency discharge power of about 25 W.

In some embodiments, the plasma activation treatment can be performed using oxygen as the plasma gas with a flow rate of about 60 sccm, with a processing pressure of about 0.1 mbar, and with a high frequency discharge power of about 70 W and a low frequency discharge power of about 35 W.

In some embodiments, the plasma activation treatment can be performed using oxygen as the plasma gas with a flow rate of about 50 sccm, with a processing pressure of 0.5 mbar, and with a high frequency discharge power of about 60 W and a low frequency discharge power of about 30 W.

In some embodiments, the plasma activation treatment can be performed using oxygen as the plasma gas with a flow rate of about 50 sccm, with a processing pressure of 0.5 mbar, and with a high frequency discharge power of about 60 W and a low frequency discharge power of about 25 W.

In some embodiments, a polishing process of the front surfaces of the first and second wafers can be performed prior to plasma activation treatments. The polishing process can include chemical mechanical polishing, wet chemical cleaning, or a combination thereof. In some embodiments, root mean square (RMS) of surface roughness of the polished front surfaces of the first and the second wafers can be less than 0.5 nm.

Figure 3B:
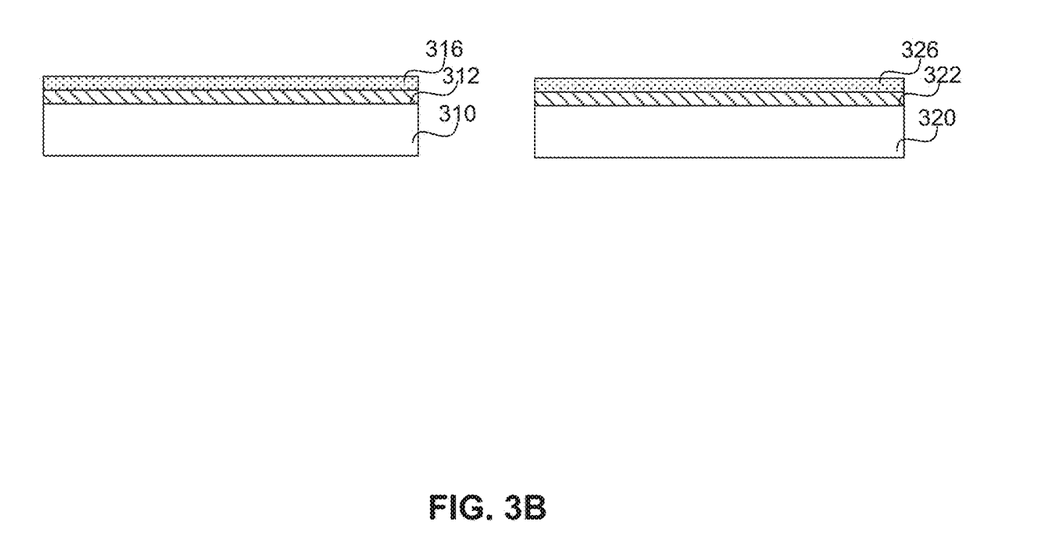

Referring to FIG. 2, method 200 proceeds to operation 204, in which a silica sol treatment is performed on the front surfaces of the first and second wafer. As illustrated in FIG. 3B, front surface 312 of first wafer 310 and front surface 322 of second wafer 320 are exposed to a silica sol during the silica sol treatment to form first silica dielectric layer 316 on front surface 312 of first wafer 310 and second silica dielectric layer 326 on front surface 322 of second wafer 320. Respective first and second silica dielectric layers 316 and 326 can include $SiO_2$ nanoparticles. In some embodiments, exposing the front surfaces of the first and second wafers can include performing a silica sol rinse on the front surfaces of the first and second wafers after one or more plasma activation treatments. The silica sol can include a colloidal suspension of a plurality of $SiO_2$ nanoparticles. In some embodiments, the diameter of $SiO_2$ nanoparticles can be about 10 nm. In some embodiments, the diameter of $SiO_2$ nanoparticles can be less than 10 nm. Surface activity of $SiO_2$ nanoparticles can be high which allows a large number of hydroxyl groups carried on the surface to be rapidly adsorbed on the wafer surfaces after one or more silica sol rinses. This in turn provides a sufficient amount of hydroxyl groups for subsequent bonding processes.

In some embodiments, the front surface of the first wafer or the second wafer is rinsed with the silica sol. In some embodiments, the front surface of both the first wafer and the second wafer are rinsed with the silica sol. Deposition of silica sol onto the wafers can be accomplished by well-known methods such as spraying and spin coating. In some embodiments, spin coating is used to deposit silica sol.

As an exemplary silica sol treatment process, the first and/or the second wafer is loaded onto a spin coater, rotating at a first rotational speed. Silica sol is applied onto the front surface of the first and/or the front surface of the second wafer through a silica sol supply tube, followed by accelerating the rotation to a second rotational speed, rinsing the front surface of the first and/or the front surface of the second wafer for a short rinsing period of time under the second rotational speed. After the short rinsing period, the silica sol supply line is turned off, and the first and/or the second wafer is spun at a third accelerated rotational speed to remove surface moisture.

Concentration of silica sol, the rotational speeds, and the rinsing period can vary to achieve a desired thickness of first silica dielectric layer 316 and second silica dielectric layer 326. In some embodiments, thicknesses of first silica dielectric layer 316 and second silica dielectric layer 326 can approach the size of a single $SiO_2$ nanoparticle or that which is minimally necessary to form a network of silicon oxide bonds between the front surfaces of the first and second wafers. In some embodiments, thicknesses of respective first and second silica dielectric layers 316 and 326 can be between about 10 nm and about 100 nm. In some embodiments, if the first wafer and/or the second wafer have an uneven surface topology, a thicker first and/or second silica dielectric layer can be used to fill the voids between the front surface of the first wafer and/or the second wafer.

In some embodiments, the silica sol has the $SiO_2$ weight concentration of no more than 35%. For example, silica sol can have a $SiO_2$ weight concentration between about 1% and 30% (inclusive). In some embodiments, silica sol can have $SiO_2$ weight concentrations of about 3%, about 10%, about 24%, or about 30%.

In some embodiments, silica sol rinsing process can include rotating the first and/or the second wafer at a rotational speed of about 200 rpm, rinsing the front surface of the first and/or the front surface of the second wafer with the silica sol for about 10 to 30 seconds under about 200 rpm rotational speed, and rotating the first and/or the second wafer at a rotational speed between about 1000 rpm and 2000 rpm to remove surface moisture. In some embodiments, after rinsing the front surface of the first and/or the second wafer with the silica sol for about 10 to 30 seconds under 200 rpm rotational speed, a relatively low rotational speed (e.g., about 500-1000 rpm) can also be performed for a relatively longer time to remove surface moisture.

In some embodiments, silica sol rinsing process can include rotating the first and/or the second wafer at a rotational speed of about 25 rpm, applying silica sol with about 3% $SiO_2$ weight concentration onto the front surface of the first and/or the second wafer, accelerating the rotation to a rotational speed of about 200 rpm, rinsing the front surface of the first and/or the second wafer with the silica sol for about 30 seconds, and accelerating the rotation to a rotational speed of about 1500 rpm to remove surface moisture.

In some embodiments, silica sol rinsing process can include rotating the first and/or the second wafer at a rotational speed of about 35 rpm, applying silica sol with about 10% $SiO_2$ weight concentration onto the front surface of the first and/or the second wafer, accelerating the rotation to a rotational speed of about 200 rpm, rinsing the front surface of the first and/or the second wafer with the silica sol for about 10 seconds, and accelerating the rotation to a rotational speed of about 2000 rpm to remove surface moisture.

In some embodiments, silica sol rinsing process can include rotating the first and/or the second wafer at a rotational speed of about 30 rpm, applying silica sol with about 24% $SiO_2$ weight concentration onto the front surface of the first and/or the second wafer, accelerating the rotation to a rotational speed of about 200 rpm, rinsing the front surface of the first and/or the second wafer with the silica sol for about 10 seconds, and accelerating the rotation to a rotational speed of about 2000 rpm to remove surface moisture.

In some embodiments, silica sol rinsing process can include rotating the first and/or the second wafer at a rotational speed of about 40 rpm, applying silica sol with about 30% $SiO_2$ weight concentration onto the front surface of the first and/or the second wafer, accelerating the rotation to a rotational speed of about 200 rpm, rinsing the front surface of the first and/or the second wafer with the silica sol for about 20 seconds, and accelerating the rotation to a rotational speed of about 2000 rpm to remove surface moisture.

In some embodiments, the first and second wafer can be rinsed with water prior to silica sol rinsing. In some embodiments, silica sol rinsing process can include a drying process using spin-rinse-drier, dry nitrogen, or other drying techniques to remove surface moisture. After plasma activation treatment and silica sol rinsing, front surfaces of the first and second wafers can be mainly terminated by silanol groups.

Figure 3C:
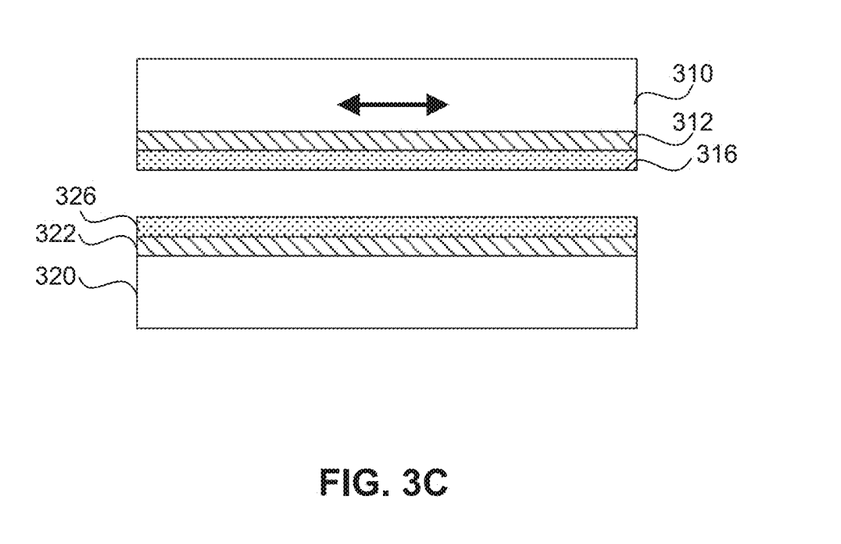

Referring to FIG. 2, method 200 proceeds to operation 206, in which a preliminary bonding process is performed on the first and second wafer. As illustrated in FIG. 3C, prior to the preliminary bonding process, first wafer 310 and second wafer 320 can be positioned in parallel and face to face with each other, with front surface 312 of first wafer 310 facing towards front surface 322 of second wafer 320. In some embodiments, a preliminary alignment process can also be performed. In the preliminary alignment process, position of first wafer 310 can be adjusted such that the centers of first wafer 310 and second wafer 320 are substantially aligned. In some embodiments, prior to the preliminary bonding process, front surface 312 of first wafer 310 and front surface 322 of second wafers 320, are positioned face to face, opposed to one another at a distance of between about 20 μm and 100 μm.

Figure 3D:
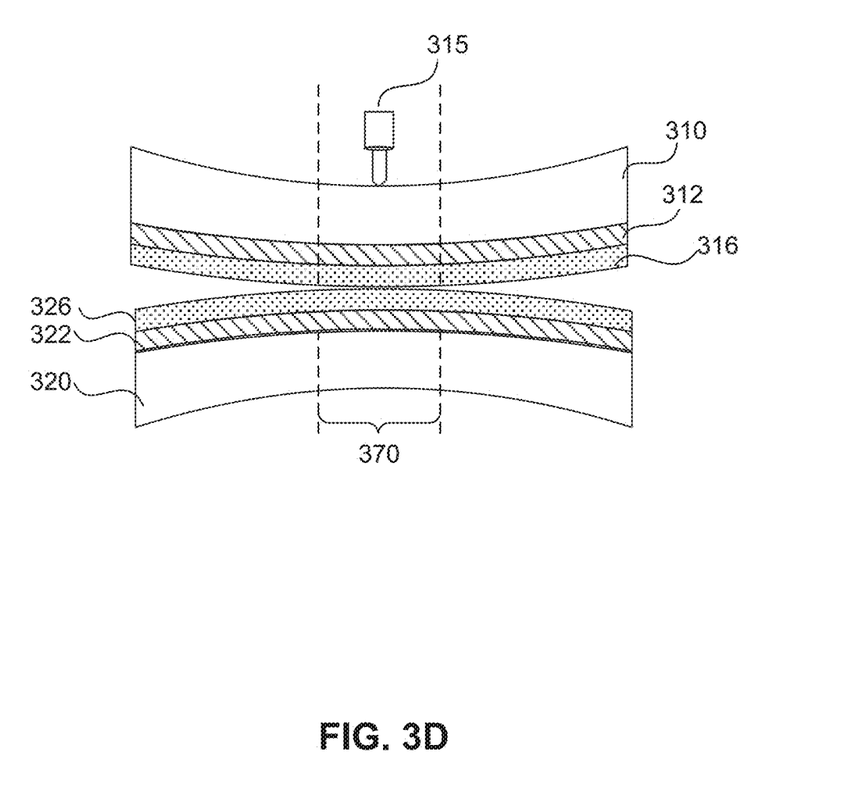

As illustrated in FIG. 3D, center zone 370 of first wafer 310 can be pressed in a downward direction by applying a first pressure to initiate the bonding process. For example, vacuum channel 315 can be released to apply the first pressure to bring first wafer 312 and second wafer 320 into contact at center zone 370. In some embodiments, the first pressure can be between about 80 mbar and 200 mbar. During this operation, van der Waals bonds can be formed between front surfaces 312 and 322 of respective first and second wafers 310 and 320 at center zone 370.

Figure 3E:
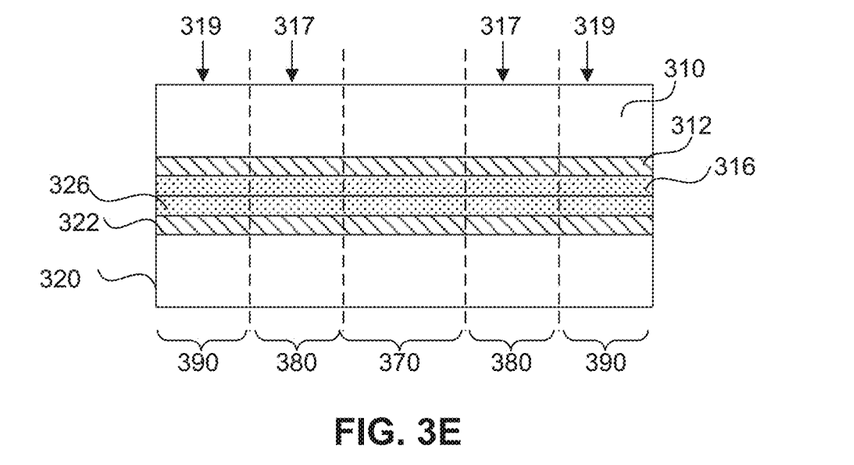

As illustrated in FIG. 3E, preliminary bonding process can further include applying a second pressure at first outer annular zone 380 of the first and the second wafers to bring first outer annular zone 380 of the first and the second wafers into contact. Vacuum channels 317 can be released to apply the second pressure at first outer annular zone 380. A radial van der Waals force bonding wave propagates outward from center zone 370 to first outer annular zone 380. Then a third pressure can be applied at second outer annular zone 390 of the first and the second wafers to bring the first and the second wafers into full contact. Vacuum channels 319 can be released to apply the third pressure at second outer annular zone 390.

In some embodiments, first and second wafers can be positioned face to face opposed to one another at a distance of about 20 μm between their respective front surfaces. A first pressure of 80 mbar can be applied to bring the center zone of the first and second wafers into contact. A second pressure can be applied by releasing vacuum channels at the first outer annular zone of the first and second wafers to bring the first outer annular zone of the first and the second wafers into contact. A third pressure can be applied by releasing vacuum channels at the second outer annular zone of the first and the second wafers to bring the first and the second wafers into full contact.

In some embodiments, the first and the second wafers are positioned face to face opposed to one another at a distance of about 20 μm between the front surface of the first wafer and the front surface of the second wafer. A first pressure of 150 mbar can be applied to bring the center zone of the first and the second wafers into contact.

In some embodiments, the first and the second wafers are positioned face to face opposed to one another at a distance of about 45 μm between the front surface of the first wafer and the front surface of the second wafer. A first pressure of 100 mbar can be applied to bring the center zone of the first and the second wafers into contact.

In some embodiments, the first and the second wafers are positioned face to face opposed to one another at a distance of about 100 μm between the front surface of the first wafer and the front surface of the second wafer. A first pressure of 200 mbar can be applied to bring the center zone of the first and the second wafers into contact.

Figure 3F:
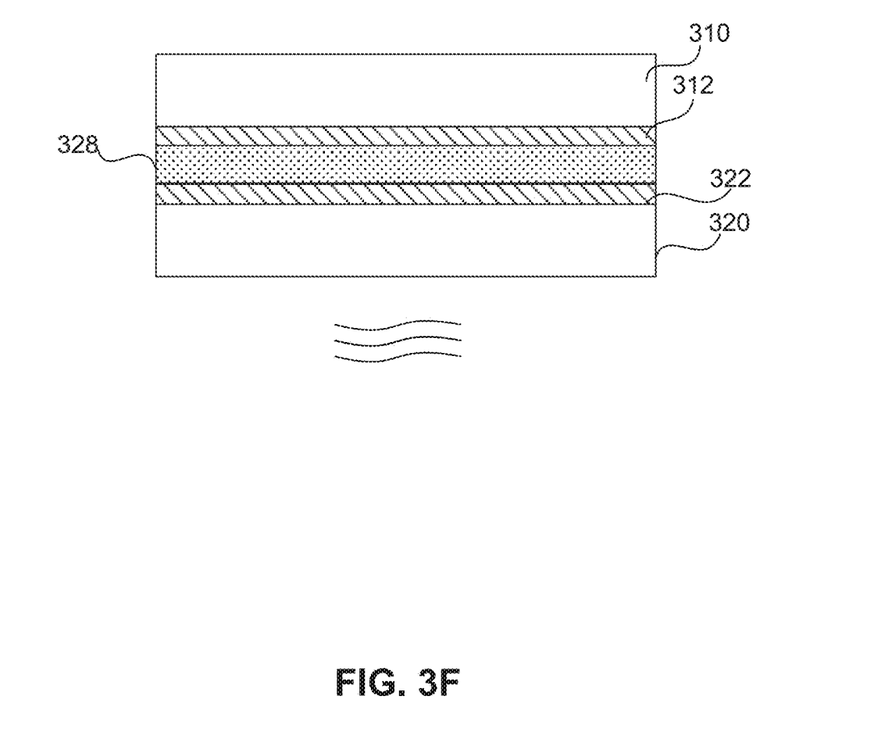

Referring to FIG. 2, method 200 proceeds to operation 208, in which a heat treatment is performed on the first and second wafers. As illustrated in FIG. 3F, the heat treatment is performed on first wafer 310 and second wafer 320 to bond front surface 312 of first wafer 310 to front surface 322 of second wafer 320. And first silica dielectric layer 316 (as shown in FIG. 3E) and second silica dielectric layer 326 (as shown in FIG. 3E) are fused into a single dielectric layer 328.

In some embodiments, the heat treatment forms a plurality of covalent bonds between the front surface of the first wafer and the front surface of the second wafer. In some embodiments, the covalent bond is Si—O—Si. In some embodiments, the covalent bond has a bond strength of at least 2.0 $J/m^2$. In some embodiments, the covalent bond has a bond strength greater than 2.0 $J/m^2$.

In some embodiments, the heat treatment can include thermally annealing the first and the second wafers after preliminary bonding. The preliminary bonded first and second wafers are thermally annealed under nitrogen atmosphere, with an annealing temperature between about 200° C. and 450° C. In some embodiments, the heat treatment time is between about 1 hour and 2 hours.

In some embodiments, the preliminary bonded first and second wafers are thermally annealed under nitrogen atmosphere, at an annealing temperature of about 200° C. for about 2 hours. In some embodiments, the preliminary bonded first and second wafers are thermally annealed under nitrogen atmosphere, at an annealing temperature of about 280° C. for about 1 hour. In some embodiments, the preliminary bonded first and second wafers can be thermally annealed under nitrogen atmosphere at an annealing temperature of about 350° C. for about 2 hours. In some embodiments, the preliminary bonded first and second wafers are thermally annealed under nitrogen atmosphere at an annealing temperature of about 400° C. for about 1 hour. In some embodiments, the above-mentioned wafer bonding process can be performed using SmartView®NT, an automated bond alignment system manufactured by EV Group, Austria.

In some embodiments, condensation reactions of silanol groups on the front surfaces of the first and second wafers can occur during the heat treatment which results in Si—O—Si bond formations between the abovementioned front surfaces. In addition, the formation of condensation reaction can also generate $H_2O$ molecules.

As illustrated in FIG. 4A, prior to the plasma activation, the wafer bonding method can include one or more polishing processes performed on front surface 312 and/or front surface 322 of first and second wafers 310 and 320, respectively. The polishing process can include chemical mechanical polishing, wet chemical cleaning, or a combination thereof.

In some embodiments, chemical mechanical polishing process can leave front surface 312 of first wafer 310 and front surface 322 of second wafer 320 with large surface roughness and voids at bonding interface 440. Silica nanoparticles 434 in the silica sol can be well filled in the voids to reduce the roughness. After the heat treatment process, silica nanoparticles 434 in the silica sol, front surface 312 of first wafer 310 and front surface 322 of second wafer 320 can be integrated (e.g., completely integrated) into a single dielectric layer 450, therefore reducing voids, as shown in FIG. 4B.

In some embodiments, root mean square (RMS) of the surface roughness of the polished front surfaces of the first and the second wafers can be less than 0.5 nm. In some embodiments, the present disclosure provides a semiconductor structure obtained by any of the above-mentioned wafer bonding methods. In some embodiments, the present disclosure also provides a semiconductor structure including a first wafer, a second wafer, and a covalence bond between a front surface of the first wafer and a front surface of the second wafer having a bond strength of at least 2.0 $J/m^2$. In some embodiments, the front surfaces of the first wafer and the second wafer include $SiO_2$, $Si_3N_4$, or a nitrogen-doped silicon carbide. In some embodiments, the covalence bond can be Si—O—Si.

Various embodiments in accordance with the present disclosure provide wafer bonding methods and semiconductor structures. The wafer bonding method disclosed herein can include: performing the plasma activation treatment on the front surface of the first wafer and the front surface of the second wafer; performing the silica sol treatment on the front surface of the first wafer and the front surface of the second wafer; performing the preliminary bonding process of the first and second wafer; and performing the heat treatment of the first and the second wafers to bond the front surface of the first wafer to the front surface of the second wafers. In some embodiments, the silica sol treatment is performed on the front surface of both first and second wafers. In some embodiments, the silica sol treatment is performed on the front surface of the first or the second wafer.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A wafer bonding method, comprising:
performing a plasma activation treatment on a front surface of a first wafer and a front surface of a second wafer;
performing a silica sol treatment on the front surfaces of the first and the second wafers such that a plurality of $SiO_2$ nanoparticles are adsorbed on the front surfaces of the first and second wafers;
applying a preliminary bonding process to the first and second wafer; and
performing a heat treatment to the first and second wafers to bond the front surface of the first wafer to the front surface of the second wafer.

2. The wafer bonding method of claim 1, wherein the plasma activation treatment comprises using oxygen or nitrogen as a plasma gas and is performed with a processing pressure between about 0.05 mbar and 0.5 mbar, a high frequency discharge power between about 40 watts and 100 watts and a low frequency discharge power between about 10 watts and 40 watts.

3. The wafer bonding method of claim 2, wherein the plasma activation treatment comprises using nitrogen as the plasma gas and is performed with a processing pressure at 0.3 mbar, the high frequency discharge power of about 60 watts, and the low frequency discharge power of about 25 watts.

4. The wafer bonding method of claim 2, wherein the plasma activation treatment comprises using oxygen as the plasma gas and is performed with a processing pressure at 0.1 mbar, the high frequency discharge power of about 70 watts, and the low frequency discharge power of about 35 watts.

5. The wafer bonding method of claim 2, wherein the plasma activation treatment comprises using oxygen as the plasma gas and is performed with a processing pressure at 0.5 mbar, the high frequency discharge power of about 60 watts, and the low frequency discharge power of about 30 watts.

6. The wafer bonding method of claim 2, wherein the plasma activation treatment comprises using oxygen as the plasma gas and is performed with a processing pressure at 0.5 mbar, the high frequency discharge power of about 60 watts, and the low frequency discharge power of about 25 watts.

7. The wafer bonding method of claim 1, wherein performing the silica sol treatment comprises rinsing the front surfaces of the first and the second wafers with the silica sol having the plurality of $SiO_2$ nanoparticles with a diameter smaller than 10 nm.

8. The wafer bonding method of claim 7, wherein performing the silica sol treatment comprises rinsing the front surfaces of the first and the second wafers with the silica sol having the $SiO_2$ nanoparticles weight concentration between about 1% and 30%.

9. The wafer bonding method of claim 8, wherein rinsing the front surfaces of the first and the second wafers with the silica sol comprises rotating the first and second wafers at a rotation speed of between about 50 rpm and 1000 rpm.

10. The wafer bonding method of claim 8, wherein rinsing the front surfaces of the first and second wafers is performed for between about 10 and 30 seconds.

11. The wafer bonding method of claim 8, further comprising a drying process after rinsing the front surfaces of the first and the second wafers with the silica sol and prior to the preliminary bonding process.

12. The wafer bonding method of claim 8, further comprising, prior to rinsing the front surface of the first and the second wafers with the silica sol, water rinsing the front surfaces of the first and the second wafers.

13. The wafer bonding method of claim 1, further comprising, prior to the preliminary bonding process, positioning the front surfaces of the first and the second wafers opposed to one another at a distance of between about 20 μm and 100 μm.

14. The wafer bonding method of claim 13, wherein the preliminary bonding process comprises applying a first pressure between about 80 and 200 mbar at a center zone of the first and the second wafers to bring the center zones into contact.

15. The wafer bonding method of claim 14, wherein the preliminary bonding process further comprises applying a second pressure at a first outer annular zone of the first and the second wafers to bring the first outer annular zones into contact.

16. The wafer bonding method of claim 15, wherein the preliminary bonding process further comprises applying a third pressure at a second outer annular zone of the first and the second wafers to bring the wafers into full contact.

17. The wafer bonding method of claim 1, wherein the heat treatment is performed at about 200-450° C. for about 1-2 hours under a nitrogen atmosphere.

18. The wafer bonding method of claim 17, wherein the heat treatment comprises forming a covalent bond of at least 2.0 J/m$^2$ between the first and the second wafers.

19. A wafer bonding method, comprising:
performing a plasma activation treatment on a front surface of a first wafer and a front surface of a second wafer;
performing a silica sol treatment on the front surface of the first wafer or the front surface of the second wafer such that a plurality of $SiO_2$ nanoparticles are adsorbed on the front surfaces of the first and second wafers;
performing a preliminary bonding process on the first and second wafers; and
performing a heat treatment of the first and the second wafers to form a bond between the first and the second wafers.

* * * * *